United States Patent
Miyazaki et al.

(10) Patent No.: US 10,026,931 B2
(45) Date of Patent: Jul. 17, 2018

(54) METHOD OF FABRICATING WHITE ORGANIC LIGHT-EMITTING DEVICE BY USING ELECTROSPRAYING

(71) Applicant: SAMSUNG ELECTRONICS CO., LTD., Suwon-si, Gyeonggi-do (KR)

(72) Inventors: Hiroshi Miyazaki, Hwaseong-si (KR); Yasushi Koishikawa, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 113 days.

(21) Appl. No.: 15/284,948

(22) Filed: Oct. 4, 2016

(65) Prior Publication Data

US 2017/0244071 A1 Aug. 24, 2017

(30) Foreign Application Priority Data

Feb. 18, 2016 (KR) ........................ 10-2016-0019157

(51) Int. Cl.
*H01L 51/56* (2006.01)
*H01L 51/00* (2006.01)
(Continued)

(52) U.S. Cl.
CPC ............ *H01L 51/56* (2013.01); *C09K 11/025* (2013.01); *C09K 11/06* (2013.01);
(Continued)

(58) Field of Classification Search
CPC .................................................. H01L 51/0006
See application file for complete search history.

(56) References Cited

U.S. PATENT DOCUMENTS 8,536,776 B2 * 9/2013 Wood ................... C09K 11/565
  313/498
8,853,678 B2 10/2014 Uchida et al.
(Continued)

FOREIGN PATENT DOCUMENTS

JP  2003231692 A  8/2003
JP  2005038672 A  2/2005
(Continued)

OTHER PUBLICATIONS

Haifeng Gao, et al., "Site Isolation of Emitters within Cross-Linked Polymer Nanoparticles for White Electroluminescence", Nano Lett. 2010, 10, 1440-1444.
(Continued)

*Primary Examiner* — Yu-Hsi D Sun
(74) *Attorney, Agent, or Firm* — Cantor Colburn LLP (57) ABSTRACT

A method of manufacturing a white organic light-emitting device (white OLED) including a first electrode, a hole transport layer, a white light-emitting layer, an electron transport layer, and a second electrode which are sequentially formed on a substrate, the method including manufacturing a red ink by mixing a red light-emitting host and a red light-emitting dopant, manufacturing a green ink by mixing a green light-emitting host and a green light-emitting dopant, manufacturing a blue ink by mixing a blue light-emitting host and a blue light-emitting dopant, and forming a white light-emitting layer as a monolayer on the hole transport layer by separately electrospraying the red ink, the green ink, and the blue ink on the hole transport layer, wherein the white light-emitting layer includes a plurality of red light-emitting domains, a plurality of green light-emitting domains, and a plurality of blue light-emitting domains on the hole transport layer.

14 Claims, 3 Drawing Sheets

(51) Int. Cl.
*H01L 51/50* (2006.01)
*C09K 11/06* (2006.01)
*C09K 11/02* (2006.01)

(52) U.S. Cl.
CPC ...... *H01L 51/0006* (2013.01); *H01L 51/0007* (2013.01); *H01L 51/5036* (2013.01); *H01L 51/5056* (2013.01); *C09K 2211/1007* (2013.01); *C09K 2211/1029* (2013.01); *C09K 2211/185* (2013.01); *H01L 51/0072* (2013.01); *H01L 51/0085* (2013.01); *H01L 2251/558* (2013.01)

(56) References Cited

U.S. PATENT DOCUMENTS

| | | |
|---|---|---|
| 2003/0076454 A1 | 4/2003 | Burroughes |
| 2015/0014670 A1 | 1/2015 | Humphries et al. |

FOREIGN PATENT DOCUMENTS

| | | |
|---|---|---|
| JP | 2015179842 A | 10/2015 |
| KR | 1020120024978 A | 3/2012 |

OTHER PUBLICATIONS

Yasushi Koishikawa, et al., "Multi-layered organic light-emitting diode fabrication using low molecular weight materials by electrospray method", Thin Solid Films 545 (2013) 527-532.

\* cited by examiner

METHOD OF FABRICATING WHITE ORGANIC LIGHT-EMITTING DEVICE BY USING ELECTROSPRAYING

CROSS-REFERENCE TO RELATED APPLICATION

This application claims priority to and the benefit of Korean Patent Application No. 10-2016-0019157, filed on Feb. 18, 2016, in the Korean Intellectual Property Office, the disclosure of which is incorporated herein by reference in its entirety.

BACKGROUND

1. Field

The present disclosure relates to methods of manufacturing a white organic light-emitting device including a white light-emitting monolayer formed by electrospraying.

2. Description of the Related Art

An organic light-emitting device (OLED) is a self-luminous device that has high light-emitting brightness and realizes clear colors while operating at a low voltage.

Recently, the performance (efficiency and lifetime) of a white OLED has been improved by modifying the characteristics of organic materials and optimizing device structure. Due to these improvements, the white OLED may be used as a rear light source for large displays and general illumination devices.

Methods of manufacturing a white OLED may be classified into two types: a method of manufacturing a monolayer type white OLED in which a single light-emitting layer is formed using a plurality of light-emitting materials and a method of manufacturing a stacking type white OLED in which a plurality of light-emitting layers that emit different colors are stacked on each other.

The stacking type white OLED has a complicated device structure, but has a higher light-emitting efficiency and a longer lifetime than the monolayer type white OLED. Also, color emission of the stacking type white OLED may be easily controlled. By comparison, the monolayer type white OLED has a relatively simple device structure, and thus, a manufacturing process thereof may be simplified, thereby greatly reducing the manufacturing costs as compared to the stacking type white OLED.

However, a monolayer type white OLED of the related art has a relatively low light-emitting efficiency and short lifetime.

SUMMARY

Provided are methods of manufacturing a white OLED including a white light-emitting monolayer which is formed by electrospraying.

According to an aspect of an embodiment, a method of manufacturing a white organic light-emitting device (OLED) includes: a first electrode, a hole transport layer (HTL), a white light-emitting layer, an electron transport layer (ETL), and a second electrode which are sequentially formed on a substrate, the method including: manufacturing a red ink by mixing a red light-emitting host and a red light-emitting dopant, manufacturing a green ink by mixing a green light-emitting host and a green light-emitting dopant, and manufacturing a blue ink by mixing a blue light-emitting host and a blue light-emitting dopant; and forming the white light-emitting layer as a monolayer on the hole transport layer by separately electrospraying the red ink, the green ink, and the blue ink on the hole transport layer, wherein the white light-emitting layer includes a plurality of red light-emitting domains, a plurality of green light-emitting domains, and a plurality of blue light-emitting domains on the HTL.

Each domain of the plurality of red light-emitting domains, the plurality of green light-emitting domains, and the plurality of blue light-emitting domains may have a height in a range from about 1 nanometer (nm) to about 10 nm and a diameter in a range from about 5 nm to about 500 nm on a surface of the HTL.

The red ink, the green ink, and the blue ink may be electrosprayed such that a weight ratio of the red light-emitting dopant to the green light-emitting dopant, to the blue light-emitting dopant may be about 1:1-5:1-10.

The electrospraying of the red ink, the green ink, and the blue ink may include electrospraying the red ink, the green ink, and the blue ink so as not to contact each other before the red ink, the green ink, and the blue ink reaching the HTL.

The electrospraying of the red ink, the green ink, and the blue ink may include alternately and repeatedly electrospraying the red ink, the green ink, and the blue ink.

The forming of the white light-emitting layer may include forming the white light-emitting layer to a thickness in a range from about 10 nm to about 100 nm.

Each domain of the plurality of red light-emitting domains, the plurality of green light-emitting domains, and the plurality of blue light-emitting domains may include only a corresponding red light-emitting dopant, a green light-emitting dopant, and a blue light-emitting dopant.

The electrospraying of the red ink, the green ink, and the blue ink may include spraying the red ink, the green ink, and the blue ink in a droplet state from corresponding storage containers and coating each of the red ink, the green ink, and the blue ink in a dried state on the HTL.

The manufacturing of the red ink, the green ink, and the blue ink may include manufacturing a solution by dissolving a corresponding light-emitting host and a corresponding light-emitting dopant in an organic solvent.

The organic solvent may have a dielectric constant in a range from about 5.5 to about 18.

The organic solvent may be a mixture of a non-polar solvent and a polar solvent.

The organic solvent may be a mixture of tetrahydrofuran (THF) and methanol (MeOH).

The HTL may include a material having a molecular weight of less than or equal to about 1,000 Daltons.

Additional aspects will be set forth in part in the description which follows and, in part, will be apparent from the description, or may be learned by practice of the presented embodiments.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings. In the drawings, thicknesses of layers and regions may be exaggerated for clarity of layers and regions. Like reference numerals refer to like elements throughout. The exemplary embodiments of the present invention are capable of various modifications and may be embodied in many different forms.

It will be understood that when an element or layer is referred to as being "on" or "above" another element or layer may include when an element or a layer is directly or indirectly on the other element or layer.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1:
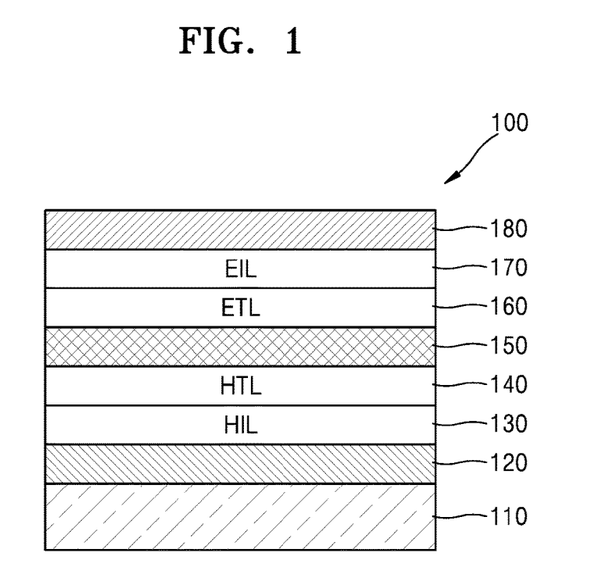
FIG. 1 is a schematic cross-sectional view of a structure of a white OLED, according to an embodiment.

FIG. 1 is a schematic cross-sectional view of a structure of a white organic light-emitting device (white OLED) 100, according to an embodiment.

Referring to FIG. 1, the white OLED 100 may include a first electrode 120, a hole injection layer (HIL) 130, a hole transport layer (HTL) 140, a white light-emitting layer 150, an electron transport layer (ETL) 160, an electron injection layer (EIL) 170, and a second electrode 180, which are sequentially formed on a substrate 110. The first electrode 120 may be an anode and the second electrode 180 may be a cathode.

The substrate 110 may be any substrate suitable for use in an OLED. For example, the substrate 110 may include glass or plastic.

The first electrode 120 may include a material having a high work function so that a hole injection process may be easily performed. The first electrode 120 may include indium tin oxide (ITO), indium zinc oxide (IZO), tin oxide ($SnO_2$), or zinc oxide (ZnO). The first electrode 120 may be formed by using a sputtering method. The first electrode 120 may be a transmission type electrode.

The HIL 130 may be formed to have a thickness in a range from about 10 nm to 100 nm by using a vacuum evaporation method. For example, the HIL 130 may include a material, such as polyaniline, polypyrrole, copper phthalocyanine (CuPc), poly(2,3-dihydrothieno-1,4-dioxin)-poly(styrenesulfonate) (PEDOT:PSS), 1,4,5,8,9,11-hexaazatriphenylene hexacarbonitrile (HAT-CN), or a combination thereof.

The HTL 140 may be formed to have a thickness in a range from about 5 nm to 100 nm by using a vacuum evaporation method. The HTL 140 may include a low molecular weight light-emitting material. For example, the HTL 140 may include materials such as N,N'-di(1-naphthyl)-N,N'-diphenyl-(1,1'-biphenyl)-4,4'-diamine α-NPD (NPB), N,N'-Bis(3-methylphenyl)-N,N'-diphenylbenzidine (TPD), 4,4'-cyclohexylidene bis[N,N-bis(4-methylphenyl) benzenamine] (TAPC), triphenyl tetramer, or a combination thereof.

The white light-emitting layer 150 may be a monolayer formed by electrospraying. The white light-emitting layer 150 may include a plurality of red light-emitting domains, a plurality of green light-emitting domains, and a plurality of blue light-emitting domains. The red light-emitting domains may each have a peak light-emitting wavelength in a wavelength region of 580 nm to 630 nm. The green light-emitting domains may each have a peak light-emitting wavelength in a wavelength region of 510 nm to 550 nm. The blue light-emitting domains may each have a peak light-emitting wavelength in a wavelength region of 440 nm to 500 nm. The white light-emitting layer 150 may be formed to have a thickness in a range from about 10 nm to about 100 nm. Each domain of the plurality of red, green, and blue light-emitting domains may be formed by spreading of the respective color in approximately a circular shape on a surface of the HTL 140 when forming the white light-emitting layer on the HTL 140 in an electrospray process.

The red light-emitting domain may include a red light-emitting host and a red light-emitting dopant. The red light-emitting host may include tris-(8-hydroxyquinolato) aluminum (Alq3), 4,4'-bis(9-carbazolyl)-biphenyl (CBP), or a combination thereof.

The red light-emitting dopant emits light by receiving energy in combination with the red light-emitting host. In detail, the red light-emitting dopant may include 4-(dicyanomethylene)-2-methyl-6-(p-dimethylamiostyryl)-4H pyran (DCM1), red (4-dicyanomethylene-2-methyl-6-(julolidine-4-yl-vinyl)-4H-pyran (DCM2), tris[1-phenylisoquinoline-$C^2$,N]iridium(III) (Ir(piq)3), 2,3,5,6-tetrakis(3,6-diphenyl-carbazol-9-yl)-1,4-dicyanobenzene (4CzTPN-Ph), or a combination thereof.

The red light-emitting dopant may be in a range from about 5 weight percent (wt. %) to about 20 wt. % of the total weight of the red light-emitting host, but the current embodiment is not limited thereto.

The green light-emitting domain may include a green light-emitting host and a green light-emitting dopant. The green light-emitting host may include a material having a sufficiently high triplet energy excitation level. The green light-emitting host may be at least one of material for forming the red light-emitting host. The green light-emitting host may include the same material used as the red light-emitting host.

The green light-emitting dopant may include coumarin 6, tris[2-phenylpyridine]iridium (III) (Ir(ppy)3), (4r,6r)-2,4,5, 6-tetra(9H-carbazol-9-yl) isophthalonitrile (4CzIPN), or a combination thereof.

The green light-emitting dopant may be in a range from about 5 wt. % to about 20 wt. % of the total weight of the green light-emitting host, but the current embodiment is not limited thereto.

The blue light-emitting domain may include a blue light-emitting host and a blue light-emitting dopant. The blue light-emitting host may include 2-Methyl-9,10-bis(naphthalen-2-yl)anthracene (MADN), 3,3-di(9H-carbazol-9-yl)biphenyl (mCBP), 1,3-bis(9H-carbazolyl-p-yl)benzene (mCP), or a combination thereof. The blue light-emitting host may include a material having a sufficiently high triplet energy excitation level. The blue light-emitting host may include a material used to form the red light-emitting host or the green light-emitting host. The blue light-emitting host may include the same material used to form the red light-emitting host.

The blue light-emitting dopant may include 2,5,8,11-tetra-tert-butylperylene (TBPe), bis[4,6-di-fluorophenyl]-pyridinato-N,$C^2$] picolinate (Firpic), 4,5-di (9H-carbazol-9-yl) phthalonitrile (2CzPN), or a combination thereof.

The blue light-emitting dopant may be in a range from about 5 wt. % to about 20 wt. % of the total weight of the blue light-emitting host, but the current embodiment is not limited thereto.

If the red, green, or blue light-emitting dopants include a phosphorescence material, triplet energy of a corresponding light-emitting host may be greater than the triplet energy of the corresponding light-emitting dopant.

If the red, green, or blue light-emitting dopants include a fluorescence material, singlet energy of a corresponding light-emitting host may be greater than the singlet energy of the corresponding light-emitting dopant.

If the red, green, or blue light-emitting dopants include a thermally activated delayed fluorescence (TADF), the triplet energy and the singlet energy of the corresponding light-emitting host respectively may be greater than those of the corresponding light-emitting dopant.

Figure 2:
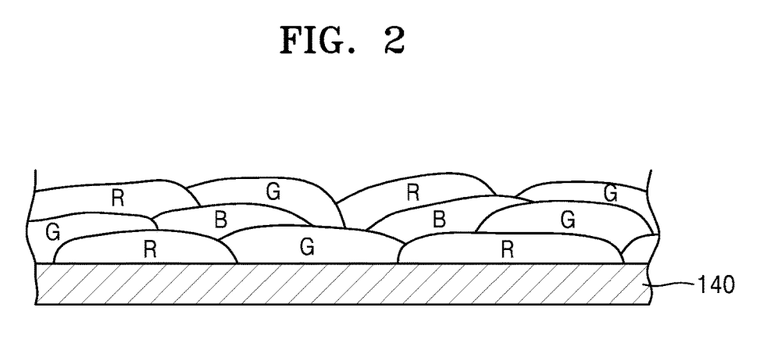
FIG. 2 is a schematic cross-sectional view of a structure of a white light-emitting layer, according to an embodiment.

FIG. 2 is a schematic cross-sectional view of a structure of the white light-emitting layer 150, according to an embodiment.

Referring to FIG. 2, red light-emitting domains R, green light-emitting domains G, and blue light-emitting domains B are spread out on an upper surface of the HTL 140. The light-emitting domains R, G, and B may have a circular shape or an oval shape. The light-emitting domains may each have a height in a range from about 1 nm to about 10 nm and a diameter (a long diameter) in a range from about 5 nm to about 500 nm. The light-emitting domains R, G, and B are widely spread out to be distributed on the surface of the HTL 140 in an electrospray process. Each of the light-emitting domains R, G, and B may include only the light-emitting dopant of the corresponding red, green, or blue light-emitting domain.

As depicted in FIG. 2, physical boundaries are formed between the domains R, G, and B, and thus, an energy movement between the light-emitting dopants is repressed. However, FIG. 2 presents only an example, and thus, more domains R, G, and B may be further stacked on the layer 140.

A ratio of the weight of the red light-emitting domains R to the green light-emitting domains G to the blue light-emitting domains B may vary according to the material used. For example, a weight ratio of red light-emitting domain: green light-emitting domain:blue light-emitting domain may be about 1:1-5:1-10.

Next, the ETL 160 may be formed on the white light-emitting layer 150 by a vacuum evaporation method. The ETL 160 may have a thickness in a range from about 10 nm to about 100 nm. The ETL 160 may include bis(8-hydroxy-2-methylquinoline)-(4-phenylphenoxy)aluminum (Balq), Alq3, 2,2',2"-(1,3,5-benzinetriyl)-tris(1-phenyl-1-H-benz-imidazole) (TPBi), bathocuproine (BCP), or a combination thereof.

The EIL 170 that facilitates injection of electrons may be formed on the ETL 160. The EIL 170 may include LiF, CsF, $Li_2O$, BaO, or a combination thereof. The EIL 170 may be formed to have a thickness in a range from about 0.1 nm to about 10 nm.

The second electrode 180 may be formed on the EIL 170. The second electrode 180 may include a material having a relatively low work function, such as a metal, an alloy, an electro-conductive compound, or a combination of these materials. The second electrode 180 may include Li, Mg, Al, Al—Li, Ca, Mg—In, Mg—Ag, or a combination thereof.

In the embodiment described above, a hole transport region includes an HIL/HTL structure, but the current embodiment is not limited thereto. For example, the HIL may be omitted or an electron stopping layer may further be formed on the HTL.

Also, in the embodiment described above, an electron transport region includes an ETL/EIL structure, but the current embodiment is not limited thereto. For example, the EIL may be omitted or a hole stopping layer may further be formed between the white light-emitting layer 150 and the ETL 160.

In the white OLED according to an embodiment, an organic material layer is formed by using a vacuum evaporation method, with the exception of the white light-emitting layer, and the white light-emitting layer is formed as a single layer, and thus, the manufacturing method may be simplified.

Also, since the white light-emitting layer is formed by using an electrospray method, a material used to form a HTL thereunder is not restricted by the white light-emitting layer, and thus, the HTL may be formed of a low molecular weight material, thereby increasing the efficiency of the white OLED. The low molecular weight material may have a molecular weight of 1,000 Daltons or less and may be formed as a thin film by a vacuum evaporation method.

When the white light-emitting layer is formed as a monolayer using a solution method, such as vacuum evaporation method or an inkjet method, since a red light-emitting dopant, a green light-emitting dopant, and a blue light-emitting dopant are formed together, energy is moved from a high energy dopant to a low energy dopant, thereby reducing the efficiency of the white OLED. However, in the current embodiment, the energy movement between the dopants is repressed by the boundaries between the red domains, green domains, and blue domains, and as a result, the efficiency of the white OLED may be increased.

Hereinafter, a method of manufacturing the white OLED 100 will be described with reference to FIG. 1.

First, a substrate 110 is prepared. The substrate 110 may be any substrate suitable for use in an OLED. For example, the substrate 110 may include glass or plastic.

Next, a first electrode 120 is formed on the substrate 110. The first electrode 120 may be formed by a deposition method or a sputtering method using a metal oxide including ITO, IZO, $SnO_2$, ZnO, or a combination thereof.

A HIL 130 may be formed on the first electrode 120 by using a vacuum evaporation method, and may have a thickness in a range from about 10 nm to about 100 nm. The HIL 130 may include a material, such as polyaniline, polypyrrole, CuPc, PEDOT:PSS, HAT-CN, or a combination thereof.

The deposition conditions of the HIL 130 may vary according to the material for forming the HIL 130.

Next, a HTL 140 may be formed on the HIL 130 by using a vacuum evaporation method, and may have a thickness in a range from about 10 nm to about 100 nm. Since dried red, green, and blue light-emitting domains are attached on the HTL 140 in the current embodiment, the type of material used to form the HTL is not limited to a polymer material. That is, the restriction of the prior art that the HTL should be formed of a polymer material due to a light-emitting layer formed by liquid coating, does not apply. Accordingly, the HTL 140 may include a low molecular weight material, and the low molecular weight material may increase the efficiency of a manufactured white OLED. The HTL 140 may include materials such as α-NPD (NPB), TPD, TAPC, triphenyl tetramer, or a combination thereof.

Next, a white light-emitting layer 150 is formed on the HTL 140. The white light-emitting layer 150 may be formed by using an electrospray method. A three color light-emitting ink is used to form the white light-emitting layer 150. In an embodiment, in order to generate white light, a red ink, a green ink, and a blue ink are separately manufactured.

In order to manufacture the red ink, a red light-emitting dopant, a red light-emitting host, and an organic solvent are mixed. The organic solvent may be a material that dissolves the red light-emitting host. For example, the organic solvent may have a dielectric constant in a range from about 5.5 to about 18. The organic solvent may be a single material or a mixture of materials. If the organic solvent has a dielectric constant of 5.5 or less, the ink may not be easily charged. If the organic solvent has a dielectric constant greater than 18, the red light-emitting host may not be easily dissolved by the organic solvent. The organic solvent may be a mixture of a non-polar solvent (a low dielectric constant solvent) and a polar solvent (a high dielectric constant solvent). The low dielectric constant solvent may include dichloromethane, chloroform, methylethyl ketone, tetrahydrofuran (THF), dioxane, toluene, xylene, etc., or a combination thereof, and the high dielectric solvent may include methanol, ethanol, acetonitrile, dimethylformamide (DMF), and dimethylsulfoxide, etc., or a combination thereof.

The organic solvent may be formed by mixing THF and methanol (MeOH) in a volume ratio of THF:MeOH of 5:2. In this case, the dielectric constant of the mixed organic solvent may be 14.7. At least one of red light-emitting dopant, for example, DCM1, DCM2, and Ir(piq)3 is added to the red light-emitting host. The red light-emitting host may include BALq or CBP. After adding the red light-emitting dopant to the red light-emitting host such that the weight of the red light-emitting dopant is about 5 wt. % to about 20 wt. % of the total weight of the red light-emitting host, the organic solvent is added to make a red ink in which a concentration of a solid portion is in a range from about 0.01 wt. % to about 0.5 wt. % of the red ink. The solid portion indicates the total weight of the red light-emitting dopant and the red light-emitting host in the red ink.

In order to manufacture the green ink, a green light-emitting dopant, for example, coumarin 6, Ir(ppy)3, or 4CzIPN may be used. A green light-emitting host may include CBP. The green light-emitting dopant is mixed with the green light-emitting host so the weight of the green light-emitting dopant is about 5% to about 20% of the total weight of the green light-emitting host. Next, the organic solvent is added to make a green ink in which a concentration of a solid portion is in a range from about 0.01 wt. % to about 0.5 wt. % of the green ink. The weight of the solid portion may indicate the total weight of the green light-emitting host and the green light-emitting dopant in the green ink.

In order to manufacture the blue ink, a blue light-emitting dopant, for example, TBPe, Firpic, or 2CzPN is used. A blue light-emitting host may include MADN, mCBP, or mCP. The blue light-emitting dopant is added to the blue light-emitting host so the weight of the blue light-emitting dopant is about 5 wt. % to about 20 wt. % of the weight of the blue light-emitting host. Next, the organic solvent is added to make the blue ink in which a concentration of a solid portion is in a range from about 0.01 wt. % to about 0.5 wt. %. The weight of the solid portion may indicate the total weight of the blue light-emitting host and the blue light-emitting dopant in the blue ink.

Figure 3:
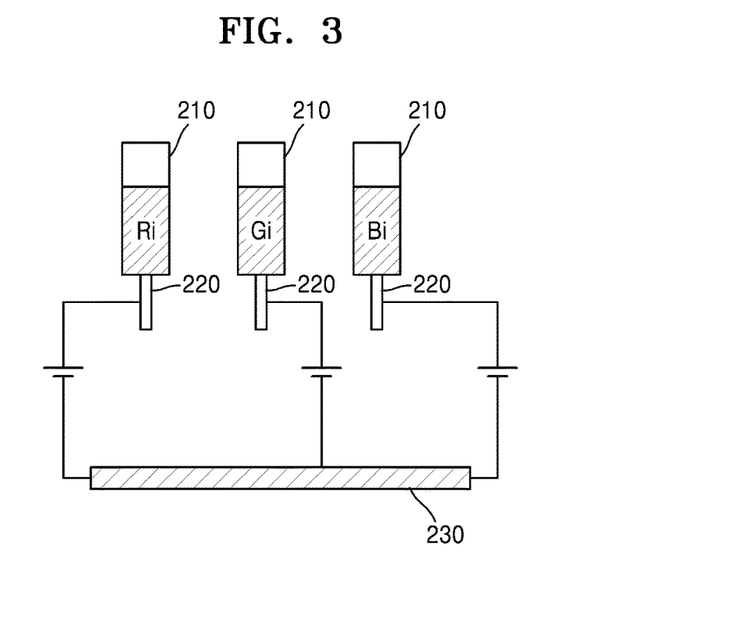
FIG. 3 is a schematic drawing of an electrospraying apparatus for forming a white light-emitting layer for a white OLED, according to an embodiment.

FIG. 3 is a schematic drawing of an electrospray apparatus for forming a white light-emitting layer of a white OLED according to an embodiment.

Referring to FIG. 3, the electrospray apparatus according to an embodiment may include three storage containers 210 respectively store a red ink Ri, a green ink Gi, and a blue ink Bi. Nozzles 220 that discharge stored inks in the storage containers 210 are disposed on a lower side of the storage containers 210. A high voltage power source is connected to each of the nozzles 220. A target substrate 230 is disposed to face the nozzles 220. The electrospray apparatus described above is disposed above the target substrate 230. The target substrate 230 disposed facing the nozzles 220 may be the HTL.

Separate power sources may be connected to each of the nozzles 220 in order to control each voltage applied to the nozzles 220. An inner diameter of the nozzles 220 may be a few tens of micrometers (μm). A voltage applied to the nozzles 220 may be in a range from about 1 kilovolt (kV) to about 30 kV, and in detail, in a range from about 5 kV to about 10 kV. A ground voltage may be applied to the target substrate 230. The ground voltage may also be applied to the first electrode 120. The diameter of the nozzles 220 and the voltage applied to the nozzles 220 are not limited thereto. For example, when the diameter of the nozzles 220 is changed, a range of voltage applied to the nozzles 220 may also be changed.

Figure 4:
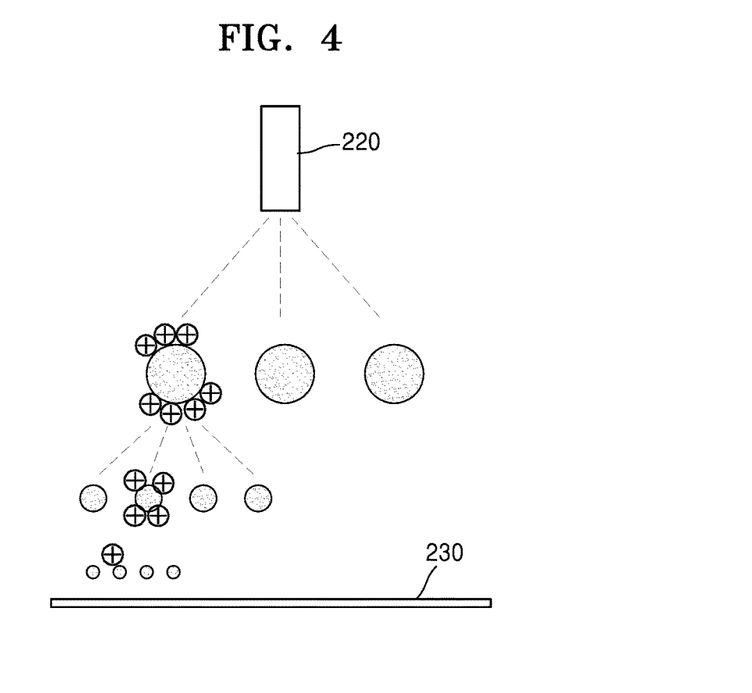
FIG. 4 is a schematic drawing of an electrospraying method, according to an embodiment.

FIG. 4 is a schematic drawing for describing an electrospray method according to an embodiment.

Referring to FIG. 4, when a voltage of a few kV is applied between the nozzles 220 and the target substrate 230, the ink in the nozzles 220 may be positively charged. When the ink in the nozzles 220 is sprayed, droplets having a diameter of a few tens of μm are ejected through the nozzles 220 towards the HTL. The droplets are positively charged. The positively charged droplets finally become a plurality of domains by being sequentially and finely separated due to coulomb repulsion. Each domain may be dried by evaporating the organic solvent in the process of moving the droplets to the target substrate 230. As shown in FIG. 2, each of the domains may be attached approximately in a horizontal direction with respect to the surface of the target substrate 230.

In order to form the white light-emitting layer 150 the red ink Ri, the green ink Gi, and the blue ink Bi may be sequentially and repeatedly sprayed.

However, the current embodiment is not limited thereto. For example, at least two of the red ink Ri, the green ink Gi, and the blue ink Bi may be simultaneously sprayed. In this case, the at least two inks should be handled so that they do not come into contact with each other before reaching the target substrate 230.

In order for the red ink Ri, the green ink Gi, and the blue ink Bi to be uniformly attached, the white light-emitting layer 150 may be formed by rotating the target substrate 230.

The white light-emitting layer 150 may be formed so that a weight ratio of red light-emitting dopant:green light-emitting dopant:blue light-emitting dopant is 1:1-5:1-10. The white light-emitting layer 150 may be formed to have a thickness approximately in a range from about 10 nm to about 100 nm.

Next, an ETL 160 having a thickness approximately in a range from 15 nm to about 50 nm may be formed on the white light-emitting layer 150 using a vacuum evaporation method. The ETL 160 may include BAlq, Alq3, TPBi, BCP, PBD, or a combination thereof.

An EIL 170 may be formed on the ETL 160 by using a vacuum evaporation method. The EIL 170 may include LiF, CsF, Li2O, BaO, or a combination thereof. The EIL 170 may have a thickness in a range from about 0.1 nm to about 10 nm.

Next, a second electrode 180 may be formed on the EIL 170. The second electrode 180 may include a material having a relatively low work function. The second electrode 180 may include a metal, an alloy, an electroconductive compound, or a combination of these materials. The second electrode 180 may include Li, Mg, Al, Al—Li, Ca, Mg—In, Mg—Ag, or a combination thereof. The second electrode 180 may be formed by using a sputtering method.

In the method of manufacturing a white OLED according to the current embodiment, organic material layers except for the white light-emitting layer are formed by using a vacuum evaporation method of the related art and the white light-emitting layer is formed as a monolayer, and thus, the manufacturing process is simplified.

Also, since the white light-emitting layer is formed by using an electrospray method, the materials used for the HTL thereunder are not restricted by the white light-emitting layer. Therefore, the HTL may be formed of a low molecular weight material, and accordingly, the light-emitting efficiency of the white OLED may be increased.

EXAMPLES

Hereinafter, a test result of the change of fluorescent spectrum due to forming of the light-emitting domains according to the current embodiment will be described. For convenience of explanation, only a blue ink and a red ink are used.

Ink Manufacture

An organic solvent was formed by mixing THF and MeOH in a volume ratio of THF:MeOH=5:2. To manufacture a red ink, Ir(piq)3 as a red light-emitting dopant was added to CBP which is a red light-emitting host, in an amount as much as 10 wt. % with respect to the CBP, and the solvent was added to make the red ink having a concentration of red solid portion of 0.05 wt. %, in which the red solid portion includes the red light-emitting dopant and the red light-emitting host.

In order to manufacture a blue ink, after adding Firpic as a blue light-emitting dopant to CBP which is a blue light-emitting host, in an amount as much as 10 wt. % with respect to the CBP, the solvent was added to make the blue ink having a concentration of blue solid portion of 0.05 wt. %, in which the blue solid portion includes the blue light-emitting dopant and the blue light-emitting host.

Comparative Example 1

After mixing a red ink and a blue ink in a weight ratio of 1:1, a light-emitting film was formed by coating the ink mixture on a substrate. Next, the light-emitting film was dried. The dried light-emitting film has a thickness of 50 nm. A fluorescence spectrum was measured by irradiating light having a wavelength of 337 nm onto the light-emitting film.

Figure 5:
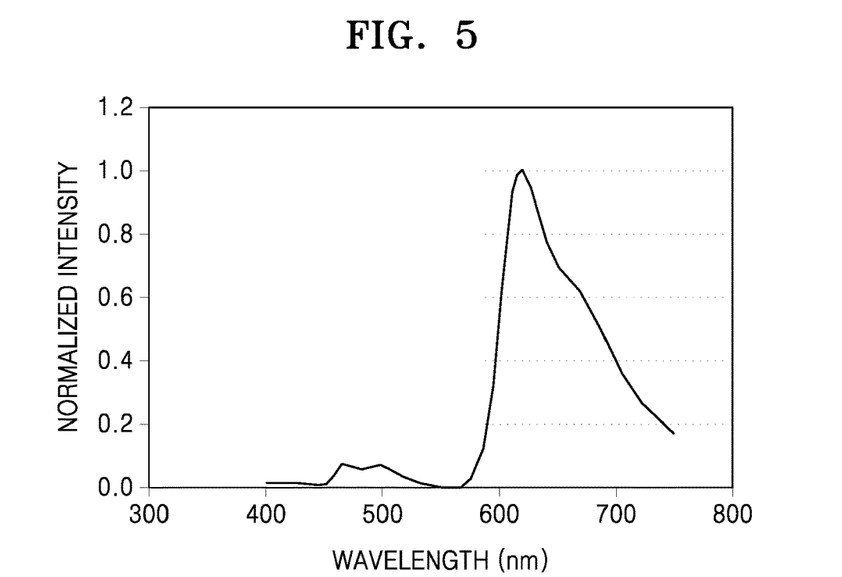
FIG. 5 is a graph of normalized intensity versus wavelength (nm) showing a fluorescence spectrum of a white light-emitting layer formed according to Comparative Example 1.

FIG. 5 is a graph showing a fluorescence spectrum of a white light-emitting layer formed using Comparative Example 1. For convenience of explanation, an ink is manufactured by using only a blue light-emitting material and a red light-emitting material.

Referring to FIG. 5, mainly a red spectrum is observed and a blue spectrum is almost not observed.

Embodiment 1

A blue ink and a red ink respectively were alternately electrosprayed on a substrate. A light-emitting film having a thickness of 50 nm was manufactured by spraying a blue light-emitting dopant and a red light-emitting dopant in a weight ratio of 1:1. A diameter of nozzles was 30 µm, a flow rate of spray was 0.2 milliliters per hour (ml/hour), and a spray distance from a tip of the nozzles to the substrate was 4.5 cm. A voltage of 6.5 kV was applied between the nozzle and the substrate. After spraying the blue ink for 5 minutes, red ink was sprayed for 5 minutes, again the blue ink was sprayed for 5 minutes, and then, the red ink was sprayed for 5 minutes. A total spray time was 20 minutes.

A fluorescence spectrum was measured by irradiating light having a wavelength of 337 nm onto the light-emitting film.

Figure 6:
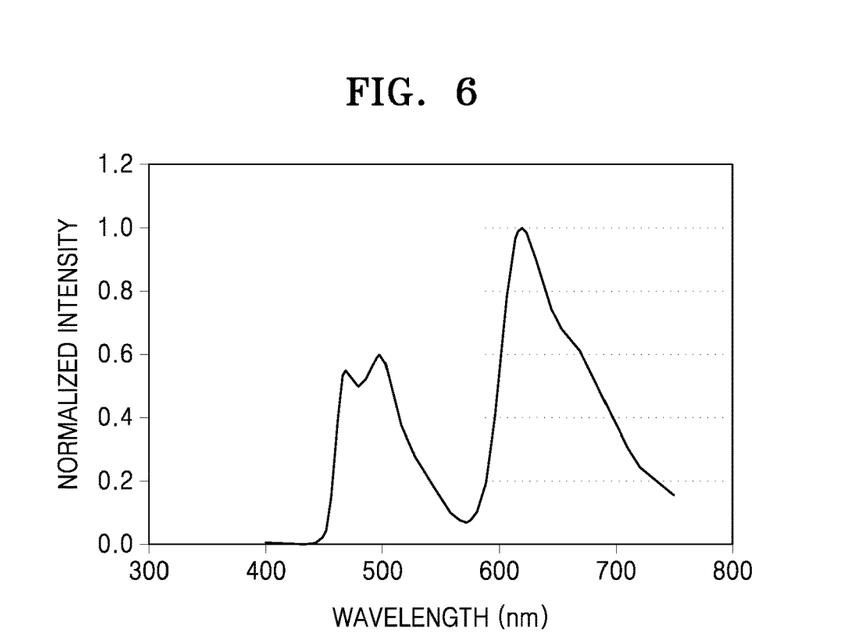
FIG. 6 is a graph of normalized intensity versus wavelength (nm) showing a fluorescence spectrum of a white light-emitting layer formed by electrospraying according to Embodiment 1.

FIG. 6 is a graph showing a fluorescence spectrum of a white light-emitting layer formed by using an electrospray method according to an embodiment.

Referring to FIG. 6, it is observed that both a blue spectrum and a red spectrum are present. Without being limited by theory, it is believed that in the organic light-emitting device according to the current embodiment, a boundary is formed between the blue light-emitting domain and the red light-emitting domain, and thus, energy movement from the blue light-emitting dopant to the red light-emitting dopant is repressed, thereby the blue spectrum was visualized.

From FIGS. 5 and 6, it is seen that the light-emitting domains prevent energy flow between the dopants, and accordingly, the light-emitting layer including light-emitting domains has increased efficiency unlike the case of mixing light-emitting dopants of the related art.

Meanwhile, in the case of forming a light-emitting layer by using a liquid coating method by mixing light-emitting dopants, as described by the prior art, in order to prevent the HTL from melting when exposed to a solvent, the HTL is formed of a polymer light-emitting material, and thus, the efficiency of a resulting OLED is reduced.

However, when an electrospray method is used as described in the current embodiment, even though the HTL is formed of a low molecular weight light-emitting material, the HTL thereunder may not melt. Therefore, the efficiency of the resultant OLED may be increased, and the lifetime of the white OLED may be increased since a proper HTL is used.

Also, since white light is emitted by forming the light-emitting layer as a monolayer, a manufacturing process is simplified.

In the method of manufacturing a white OLED according to an embodiment, organic material layers other than the white light-emitting layer, are formed using a vacuum evaporation method while the white light-emitting layer is formed as a monolayer, and thus, the manufacturing process is simplified.

Also, since the white light-emitting layer is formed by using an electrospray method, materials for the HTL thereunder are not restricted by the white light-emitting layer. Therefore, the HTL may be formed by using various materials, and accordingly, the light-emitting efficiency and the lifetime of the white OLED may be increased.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a white organic light-emitting device comprising a first electrode, a hole transport layer, a white light-emitting layer, an electron transport layer, and a second electrode which are sequentially formed on a substrate, the method comprising:
   manufacturing a red ink by mixing a red light-emitting host and a red light-emitting dopant;
   manufacturing a green ink by mixing a green light-emitting host and a green light-emitting dopant; and
   manufacturing a blue ink by mixing a blue light-emitting host and a blue light-emitting dopant; and
   forming the white light-emitting layer as a monolayer on the hole transport layer by separately electrospraying the red ink, the green ink, and the blue ink on the hole transport layer, wherein the white light-emitting layer comprises a plurality of red light-emitting domains, a plurality of green light-emitting domains, and a plurality of blue light-emitting domains.

2. The method of claim 1, wherein each domain of the plurality of red light-emitting domains, the plurality of green light-emitting domains, and the plurality of blue light-emitting domains has a height in a range from about 1 nanometer to about 10 nanometers and a diameter in a range from about 5 nanometers to about 500 nanometers, on a surface of the hole transport layer.

3. The method of claim 1, wherein the red ink, the green ink, and the blue ink are electrosprayed such that a weight ratio of the red light-emitting dopant to the green light-emitting dopant to the blue light-emitting dopant is about 1:1-5:1-10.

4. The method of claim 1, wherein the electrospraying of the red ink, the green ink, and the blue ink comprises electrospraying the red ink, the green ink, and the blue ink so as not to contact each other before the red ink, the green ink, and the blue ink reach the hole transport layer.

5. The method of claim 4, wherein the electrospraying of the red ink, the green ink, and the blue ink comprises alternately and repeatedly electrospraying the red ink, the green ink, and the blue ink.

6. The method of claim 1, wherein the forming of the white light-emitting layer comprises forming the white light-emitting layer to have a thickness in a range from about 10 nanometers to about 100 nanometers.

7. The method of claim 1, wherein each domain of the plurality of red light-emitting domains, the plurality of green light-emitting domains, and the plurality of blue light-emitting domains comprises only a corresponding red light-emitting dopant, a green light-emitting dopant, and a blue light-emitting dopant.

8. The method of claim 1, wherein the electrospraying of the red ink, the green ink, and the blue ink comprises spraying the red ink, the green ink, and the blue ink in a droplet state from corresponding storage containers and coating each of the red ink, the green ink, and the blue ink in a dried state on the hole transport layer.

9. The method of claim 1, wherein the manufacturing of the red ink, the green ink, and the blue ink comprises manufacturing a solution by dissolving a corresponding light-emitting host and a corresponding light-emitting dopant in an organic solvent.

10. The method of claim 9, wherein the organic solvent has a dielectric constant in a range from about 5.5 to about 18.

11. The method of claim 10, wherein the organic solvent is a mixture of a non-polar solvent and a polar solvent.

12. The method of claim 11, wherein the organic solvent is a mixture of tetrahydrofuran and methanol.

13. The method of claim 1, wherein the hole transport layer comprises a material having a molecular weight of less than or equal to about 1,000 Daltons.

14. The method of claim 13, wherein the hole transport layer comprises N,N'-di(1-naphthyl)-N,N'-diphenyl-(1,1'-biphenyl)-4,4'-diamine, N,N'-bis(3-methylphenyl)-N,N'-diphenylbenzidine, 4,4'-cyclohexylidene bis[N,N-bis(4-methylphenyl)benzenamine], a triphenyl tetramer, or a combination thereof.

* * * * *